(12) United States Patent
Chen et al.

(10) Patent No.: US 12,341,498 B2
(45) Date of Patent: Jun. 24, 2025

(54) BIDIRECTIONAL SIGNAL CONVERSION CIRCUIT

(71) Applicant: REALTEK SEMICONDUCTOR CORPORATION, Hsinchu (TW)

(72) Inventors: Leaf Chen, Hsinchu (TW); Jiun-Hung Pan, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 137 days.

(21) Appl. No.: 18/109,470

(22) Filed: Feb. 14, 2023

(65) Prior Publication Data

US 2023/0268913 A1    Aug. 24, 2023

(51) Int. Cl.
*H03K 17/0412*  (2006.01)
*H03K 17/693*   (2006.01)
*H03K 19/0185*  (2006.01)

(52) U.S. Cl.
CPC ..... *H03K 17/04123* (2013.01); *H03K 17/693* (2013.01); *H03K 19/018592* (2013.01)

(58) Field of Classification Search
CPC ............. H03K 17/04; H03K 17/04123; H03K 17/693; H03K 19/0175; H03K 19/017509; H03K 19/018; H03K 19/018507; H03K 19/018592
See application file for complete search history.

(56) References Cited

U.S. PATENT DOCUMENTS

| | | | | |
|---|---|---|---|---|
| 5,877,633 | A  * | 3/1999  | Ng ........................ | H04L 5/1423 |
| | | | | 326/86 |
| 6,320,408 | B1 * | 11/2001 | Kwong .......... | H03K 19/018528 |
| | | | | 327/437 |
| 6,717,456 | B2   | 4/2004  | Watanabe | |
| 6,822,480 | B1 * | 11/2004 | McCalmont ... | H03K 19/018592 |
| | | | | 326/83 |
| 7,667,519 | B2   | 2/2010  | Welty | |
| 10,566,975 | B1 * | 2/2020  | Tiwari ................ | G06F 13/4004 |
| 10,659,051 | B1 * | 5/2020  | Tiwari ........... | H03K 19/018592 |
| 11,405,037 | B2 * | 8/2022  | Tiwari ................ | H03K 5/1252 |
| 2006/0261877 | A1 * | 11/2006 | Welty ............ | H03K 19/018521 |
| | | | | 327/427 |

(Continued)

OTHER PUBLICATIONS

Moon et al. "A Guide to Voltage Translation With TXS-Type Translators", Jun. 2010, Texas Instruments.

*Primary Examiner* — Jason M Crawford
(74) *Attorney, Agent, or Firm* — WPAT, PC

(57) ABSTRACT

A bidirectional signal conversion circuit is configured to perform a signal conversion between a first port and a second port, and includes a switch, a first pull-up resistor, a second pull-up resistor, a first output-response enhancement circuit, and a second output-response enhancement circuit. The switch is coupled between the first port and the second port, and operates according to a bias. The first (second) pull-up resistor is coupled between the first (second) port and a high (low) voltage terminal having a high (low) voltage. The first (second) output-response enhancement circuit includes a first (second) alternative-current (AC) coupling circuit and a first (second) output-stage circuit. When the first (second) port and the second (first) port functions as an input port and an output port respectively, the first (second) output-response enhancement circuit is operable to accelerate the transient response of the output port.

11 Claims, 9 Drawing Sheets

(56) References Cited

U.S. PATENT DOCUMENTS

| | | | |
|---|---|---|---|
| 2008/0164932 A1* | 7/2008 | Welty | H03K 19/018592 |
| | | | 327/333 |
| 2009/0243695 A1* | 10/2009 | Thoma | H03K 19/018557 |
| | | | 327/392 |
| 2020/0201795 A1* | 6/2020 | Maung | H04L 5/16 |
| 2023/0268913 A1* | 8/2023 | Chen | H03K 17/693 |
| | | | 326/62 |

* cited by examiner

BIDIRECTIONAL SIGNAL CONVERSION CIRCUIT

BACKGROUND OF THE INVENTION

1. Field of the Invention

The present disclosure relates to a signal conversion circuit, especially to a bidirectional signal conversion circuit.

2. Description of Related Art

Nowadays, an electronic product usually supports a lot of functions, and therefore needs many kinds of integrated circuits (ICs) and transmission interfaces. However, different kinds of ICs/transmission interfaces normally operate based on different power supply voltages, and thus the signal transmission between any two of the ICs/transmission interfaces is generally realized with a voltage conversion circuit which ensures that the ICs/transmission interfaces operate normally and prevents semiconductor components of the ICs/transmission interfaces from being damaged by over-voltage.

FIG. 1 shows a conventional bidirectional level shifter 100 coupled between a first port 102 and a second port 104. The first port 102 and the second port 104 are a part of a first IC/transmission interface (not shown) and a part of a second IC/transmission interface (not shown) respectively, and the first IC/transmission interface and the second IC/transmission interface operate based on a high power supply voltage HV (e.g., 3.3V or 5V) and a low power supply voltage LV (e.g., 1.2V or 3.3V). The bidirectional level shifter 100 includes a first pull-up resistor 110, a second pull-up resistor 120, and an N-channel metal-oxide-semiconductor (NMOS) transistor 130. The first pull-up resistor 110 has one terminal for receiving the high power supply voltage HV and another terminal for being coupled with the first port 102. The second pull-up resistor 120 has one terminal for receiving the low power supply voltage LV and another terminal for being coupled with the second port 104. The gate of the NMOS transistor 130 is for receiving the lower power supply voltage LV. The above circuit configuration relies on the first pull-up resistor 110/second pull-up resistor 120 to pull up the voltage at the first port 102/second port 104, and relies the NMOS transistor 130 to pull down the voltage at the first port 102/second port 104 when the NMOS transistor 130 is turned on. Although this circuit configuration is simple, its pull-up capability depends on resistors and is insufficient, and its pull-down capability is limited by the on-resistance (Ron) of the NMOS transistor 130; accordingly, the signal transmission speed under the circuit configuration is very slow.

There are other kinds of bidirectional level shifters which are found in the US patent of the patent number "U.S. Pat. No. 6,717,456", the US patent of the patent number "U.S. Pat. No. 7,667,519", and the publication "Dave Moon, Aeysha *Sultana*, "A Guide to Voltage Translation With TXS-Type Translators" (https://www.ti.com/lit/an/scea044/scea044.pdf?ts=1638018613805 &ref url=https %253A %252F %252Fwww.google.com %252F)" published by Texas Instrument (TI). These level shifters use a lot of additional circuits and have the problem of significant gate delay.

SUMMARY OF THE INVENTION

An object of the present disclosure is to provide a bidirectional signal conversion circuit as an improvement over the prior art.

An embodiment of the bidirectional signal conversion circuit of the present disclosure is configured to perform a signal conversion between a first port and a second port, and includes a switch, a first pull-up resistor, a second pull-up resistor, a first output-response enhancement circuit, and a second output-response enhancement circuit. The switch is coupled between the first port and the second port, and configured to be conducting or non-conducting according to a bias, the voltage at the first port, and the voltage at the second port. The first pull-up resistor is coupled between the first port and a first voltage terminal, wherein the voltage at the first voltage terminal is a first voltage. The second pull-up resistor is coupled between the second port and a second voltage terminal, wherein the voltage at the second voltage terminal is a second voltage different from the first voltage. The first output-response enhancement circuit is coupled between the first port and the second port, and configured to accelerate a transient response of an output port when the first port and the second port function as an input port and the output port respectively. The first output-response enhancement circuit includes a first alternative-current (AC) coupling circuit and a first output-stage circuit, wherein: the first AC coupling circuit is coupled between the first port and the first output-stage circuit, and configured to output a first control signal according to the variation in the voltage at the first port; and the first output-stage circuit is coupled between the first AC coupling circuit and the second port, and configured to couple one of the second voltage terminal and a ground terminal with the second port according to the first control signal and thereby accelerate the variation in the voltage at the second port. The second output-response enhancement circuit is coupled between the second port and the first port, and configured to accelerate the transient response of the output port when the second port and the first port function as the input port and the output port respectively. The second output-response enhancement circuit includes a second AC coupling circuit and a second output-stage circuit, wherein: the second AC coupling circuit is coupled between the second port and the second output-stage circuit, and configured to output a second control signal according to the variation in the voltage at the second port; and the second output-stage circuit is coupled between the second AC coupling circuit and the first port, and configured to couple one of the first voltage terminal and the ground terminal with the first port according to the second control signal and thereby accelerate the variation in the voltage at the first port.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The present specification discloses a bidirectional signal conversion circuit capable of rapidly and directly changing the voltage at its output stage and consequently increasing its signal transmission speed. The bidirectional signal conversion circuit can be realized in a cost-effective manner.

Figure 1:
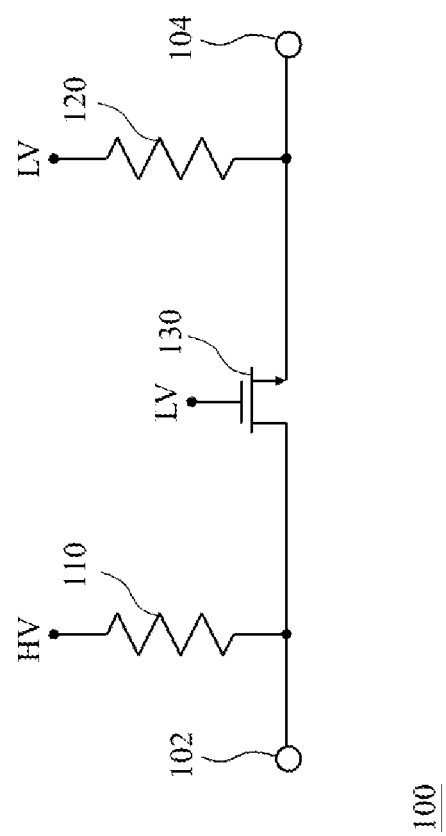
FIG. 1 shows a conventional bidirectional level shifter.
Figure 2:
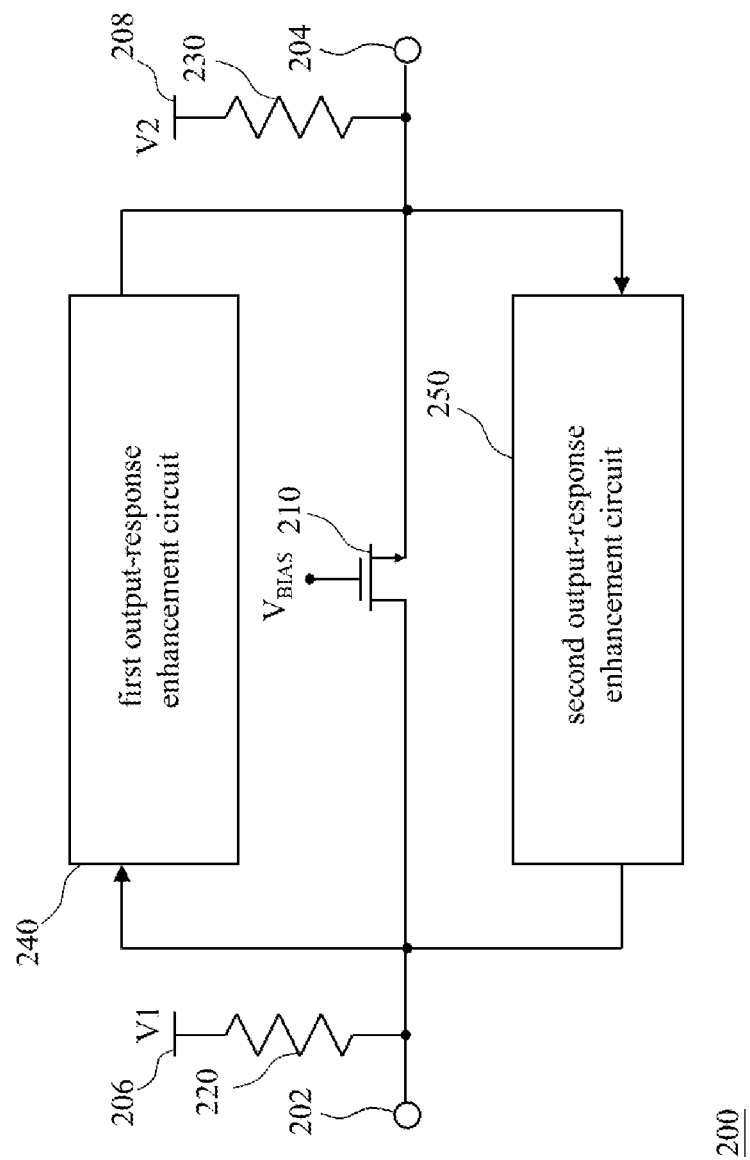
FIG. 2 shows an embodiment of the bidirectional signal conversion circuit of the present disclosure.

FIG. 2 shows an embodiment of the bidirectional signal conversion circuit of the present disclosure. The bidirectional signal conversion circuit 200 of FIG. 2 is configured to perform a signal conversion between a first port 202 and a second port 204. The first port 202 and the second port 204 are a part of a first integrated circuit (IC)/transmission interface (not shown) and a part of a second IC/transmission interface (not shown) respectively, and the first IC/transmission interface and the second IC/transmission interface operate based on a first voltage V1 (e.g., 3.3V or 5V) and a second voltage V2 (e.g., 1.2V or 3.3V) respectively, wherein the first voltage V1 is higher than the second voltage V2, and the second voltage V2 is higher than a ground voltage. The bidirectional signal conversion circuit 200 includes a switch 210, a first pull-up resistor 220, a second pull-up resistor 230, a first output-response enhancement circuit 240, and a second output-response enhancement circuit 250. These circuits are described in detail in the later paragraphs. It is noted that the first pull-up resistor 220 and the second pull-up resistor 230 may be omitted according to the demand for implementation.

In regard to the embodiment of FIG. 2, the switch 210 is coupled between the first port 202 and the second port 204, and configured to be conducting or non-conducting according to a bias $V_{BIAS}$, the voltage at the first port 202, and the voltage at the second port 204, wherein the switch 210 can be an N-channel metal-oxide-semiconductor (NMOS) transistor or any adequate known/self-developed switch chosen according to the demand for implementation, and the bias $V_{BIAS}$ can be equal to the second voltage V2 or any adequate voltage determined according to the demand for implementation. The first pull-up resistor 220 is coupled between the first port 202 and a first voltage terminal 206, wherein the voltage at the first voltage terminal 206 is the first voltage V1. The second pull-up resistor 230 is coupled between the second port 204 and a second voltage terminal 208, wherein the voltage at the second voltage terminal 208 is the second voltage V2. The first output-response enhancement circuit 240 is coupled between the first port 202 and the second port 204, and configured to accelerate a transient response of an output port when the first port 202 and the second port 204 function as an input port and the output port respectively. The second output-response enhancement circuit 250 is coupled between the second port 204 and the first port 202, and configured to accelerate the transient response of the output port when the second port 204 and the first port 202 function as the input port and the output port respectively.

Figure 3:
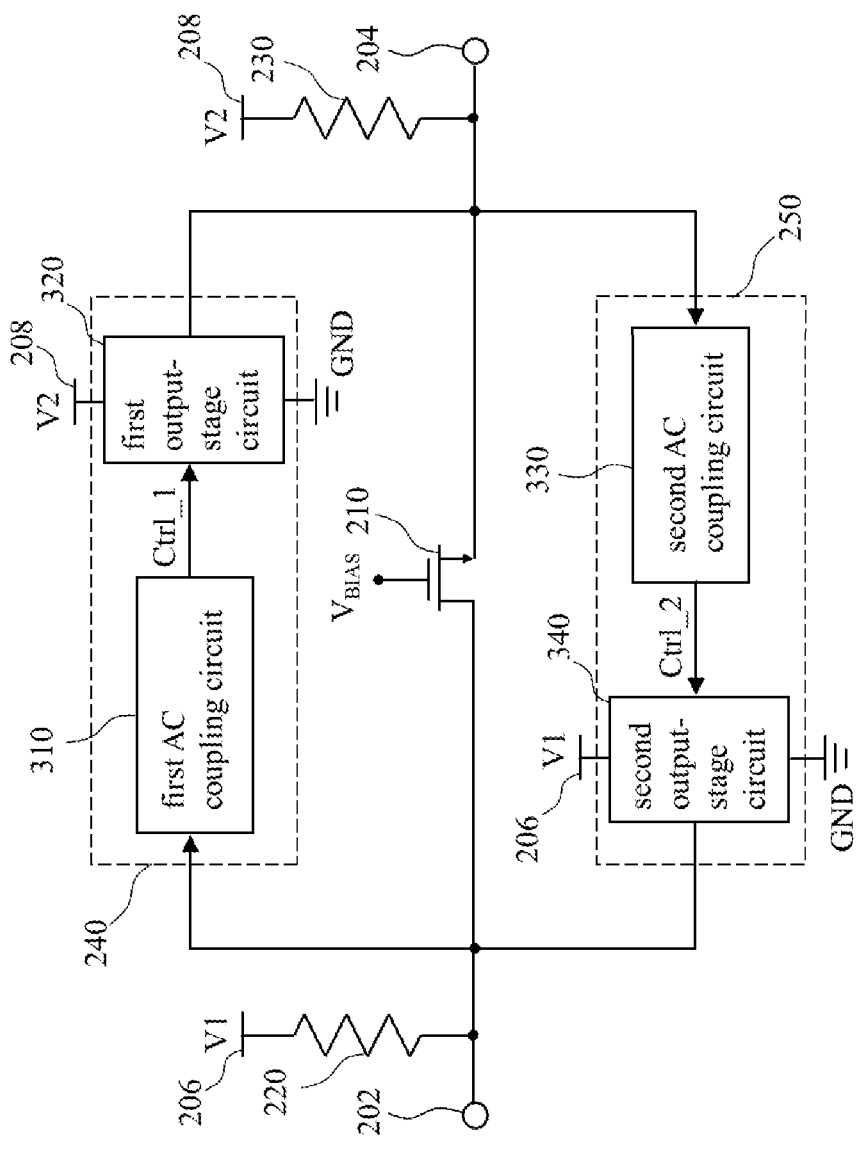
FIG. 3 shows an embodiment of the first and second output-response enhancement circuits of FIG. 2.

FIG. 3 shows an embodiment of the first output-response enhancement circuit 240 and the second output-response enhancement circuit 250 of FIG. 2. The first output-response enhancement circuit 240 includes a first alternative-current (AC) coupling circuit 310 and a first output-stage circuit 320 (e.g., switch circuit), wherein: the first AC coupling circuit 310 is coupled between the first port 202 and the first output-stage circuit 320, and configured to block the direct-current (DC) voltage from the first port 202 and to output a first control signal Ctrl_1 according to the variation in the AC voltage at the first port 202; and the first output-stage circuit 320 is coupled between the first AC coupling circuit 310 and the second port 204, and configured to couple one of the second voltage terminal 208 and a ground terminal GND with the second port 204 according to the first control signal Ctrl_1 and thereby accelerate the variation in the voltage at the second port 204, wherein the voltage at the ground terminal GND is the aforementioned ground voltage. The second output-response enhancement circuit 250 includes a second AC coupling circuit 330 and a second output-stage circuit 340 (e.g., switch circuit), wherein: the second AC coupling circuit 330 is coupled between the second port 204 and the second output-stage circuit 340, and configured to output a second control signal Ctrl_2 according to the variation in the AC voltage at the second port 204; and the second output-stage circuit 340 is coupled between the second AC coupling circuit 330 and the first port 202, and configured to couple one of the first voltage terminal 206 and the ground terminal GND with the first port 202 according to the second control signal Ctrl_2 and thereby accelerate the variation in the voltage at the first port 202.

Figure 4:
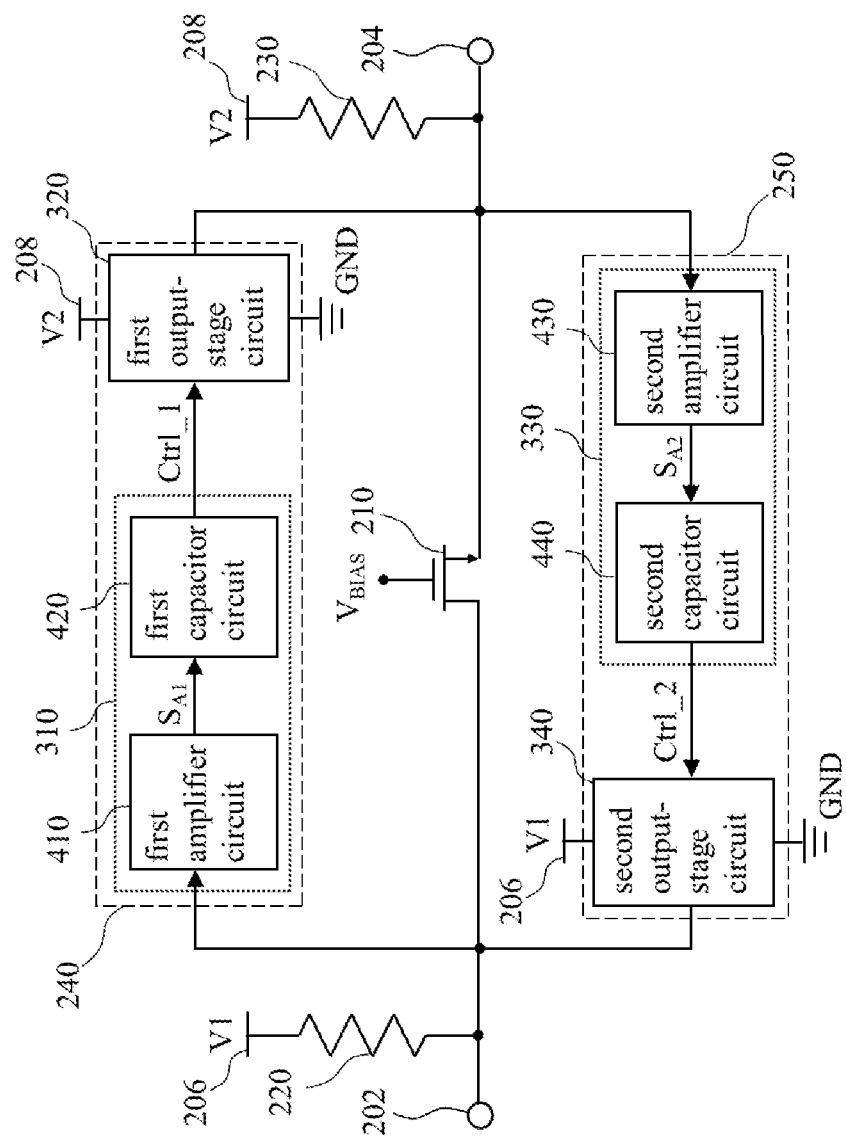
FIG. 4 shows an embodiment of the first and second AC coupling circuits of FIG. 3.

FIG. 4 shows an embodiment of the first AC coupling circuit 310 and the second AC coupling circuit 330 of FIG. 3. The first AC coupling circuit 310 includes a first amplifier circuit 410 and a first capacitor circuit 420. The first amplifier circuit 410 is configured to output a first amplification signal Sa1 according to the voltage at the first port 202. The first capacitor circuit 420 is configured to generate the first control signal Ctrl_1 according to the first amplification signal Sa1. The second AC coupling circuit 330 includes a second amplifier circuit 430 and a second capacitor circuit 440. The second amplifier circuit 430 is configured to output a second amplification signal $S_{A2}$ according to the voltage at the second port 204. The second capacitor circuit 440 is configured to generate the second control signal Ctrl_2 according to the second amplification signal $S_{A2}$. In an exemplary implementation, each of the first amplifier circuit 410 and the second amplifier circuit 420 includes at least one of the following: an operational amplifier; an inverter; a comparator; and a level shifter.

Figure 5:
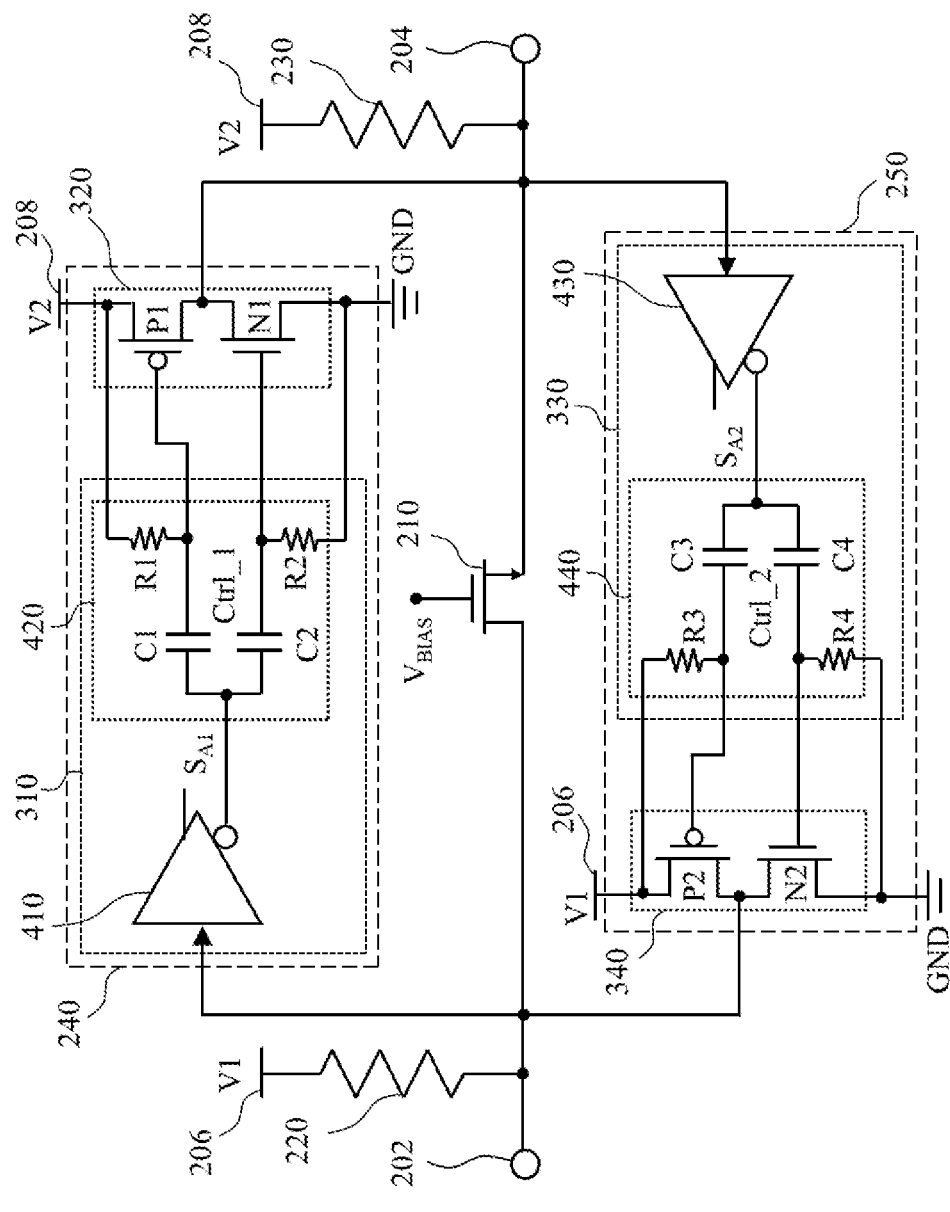
FIG. 5 shows an embodiment of the first and second output-stage circuits, the first and second amplifier circuits, and the first and second capacitor circuits of FIG. 4.

FIG. 5 shows an embodiment of the first output-stage circuit 320, the first amplifier circuit 410, the first capacitor circuit 420, the second output-stage circuit 340, the second amplifier circuit 430, and the second capacitor circuit 440 of FIG. 4. The first output-stage circuit 320 in FIG. 5 is an inverter circuit including a first P-channel MOS (PMOS) transistor P1 and a first NMOS transistor N1. The transistor P1 is coupled between the second voltage terminal 208 and the second port 204, and configured to output the second voltage V2 to the second port 204 when it is turned on. The NMOS transistor N1 is coupled between the ground terminal GND and the second port 204, and configured to output the ground voltage to the second port 204 when it is turned on. The first amplifier circuit 410 is configured to amplify and invert the voltage at the first port 202 and thereby output the first amplification signal $S_{A1}$. The first capacitor circuit 420 includes a first capacitor C1 and a second capacitor C2. The first capacitor C1 is coupled between the first amplifier circuit 410 and the transistor P1, and configured to generate a first PMOS control signal of the first control signal Ctrl_1 according to the first amplification signal $S_{A1}$ so as to control the operation of the transistor P1. The second capacitor C2 is coupled between the first amplifier circuit 410 and the transistor N1, and configured to generate a first NMOS control signal of the first control signal Ctrl_1 according to the first amplification signal $S_{A1}$ so as to control the operation of the transistor N1. In an alternative embodiment, the first capacitor C1 and the second capacitor C2 are replaced with a single capacitor, wherein the single capacitor includes one terminal coupled with the first amplifier circuit 410 or the first port 202 (when the first amplifier circuit 410 is omitted) and another terminal coupled with the transistor P1 and the transistor N1, and the single capacitor is configured to output the first control signal Ctrl_1 according to the variation in the voltage at the first port 202 and thereby control the transistor P1 and the transistor N1.

In regard to the embodiment of FIG. 5, the second output-stage circuit 340 is an inverter circuit including a second PMOS transistor P2 and a second NMOS transistor N2. The transistor P2 is coupled between the first voltage terminal 206 and the first port 202, and configured to output the first voltage V1 to the first port 202 when it is turned on. The NMOS transistor N2 is coupled between the ground terminal GND and the first port 202, and configured to output the ground voltage to the first port 202 when it is turned on. The second amplifier circuit 430 is configured to amplify and invert the voltage at the second port 204 and thereby output the second amplification signal $S_{A2}$. The second capacitor circuit 440 includes a third capacitor C3 and a fourth capacitor C4. The third capacitor C3 is coupled between the second amplifier circuit 430 and the transistor P2, and configured to generate a second PMOS control signal of the second control signal Ctrl_2 according to the second amplification signal $S_{A2}$ so as to control the operation of the transistor P2. The fourth capacitor C4 is coupled between the second amplifier circuit 430 and the transistor N2, and configured to generate a second NMOS control signal of the second control signal Ctrl_2 according to the second amplification signal $S_{A2}$ so as to control the operation of the transistor N2. In an alternative embodiment, the third capacitor C3 and the fourth capacitor C4 are replaced with a single capacitor, wherein the single capacitor includes one terminal coupled with the second amplifier circuit 430 or the second port 204 (when the second amplifier circuit 430 is omitted) and another terminal coupled with the transistor P2 and the transistor N2, and the single capacitor is configured to output the second control signal Ctrl_2 according to the variation in the voltage at the second port 204 and thereby control the transistor P2 and the transistor N2.

In regard to the embodiment of FIG. 5, the first capacitor circuit 420 further includes a first resistor R1 and a second resistor R2, and the second capacitor circuit 440 further includes a third resistor R3 and a fourth resistor R4. The first resistor R1 includes one terminal coupled with the first capacitor C1 and the gate of the transistor P1 and another terminal coupled with the second voltage terminal 208 and the source of the transistor P 1. The second resistor R2 includes one terminal coupled with the second capacitor C2 and the gate of the transistor N1 and another terminal coupled with the ground terminal GND and the source of the transistor N1. The third resistor R3 includes one terminal coupled with the third capacitor C3 and the gate of the transistor P2 and another terminal coupled with the first voltage terminal 206 and the source of the transistor P2. The fourth resistor R4 includes one terminal coupled with the fourth capacitor C4 and the gate of the transistor N2 and another terminal coupled with the ground terminal GND and the source of the transistor N2. Each above-mentioned resistor can prevent the gate of the transistor, which is coupled with this resistor, from being floating and thereby ensure that the transistor can fully be turned off when it is supposed to be turned off. These resistors may be omitted, if practicable.

Figure 6:
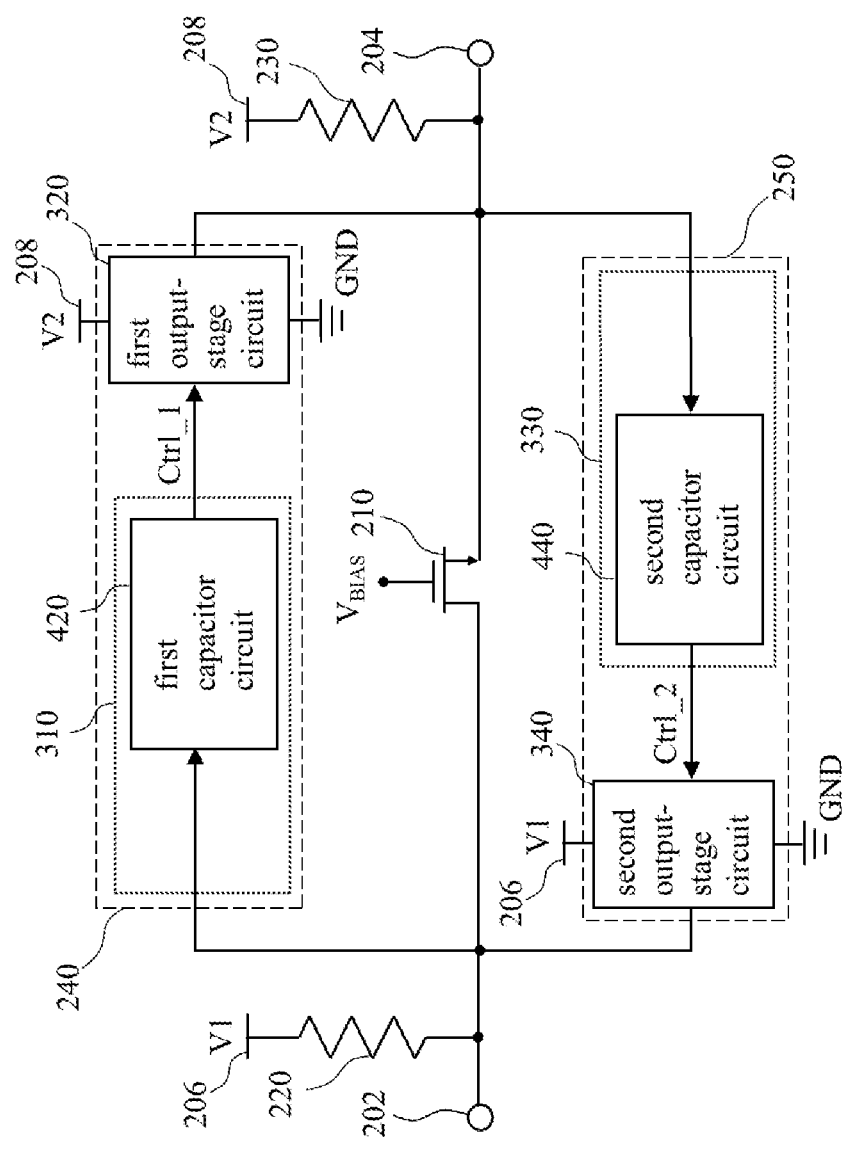
FIG. 6 shows another embodiment of the first and second AC coupling circuits of FIG. 3.

FIG. 6 shows another embodiment of the first AC coupling circuit 310 and the second AC coupling circuit 330 of FIG. 3. The main difference between the embodiment of FIG. 6 and the embodiment of FIG. 4 is that FIG. 6 does not include the first amplifier circuit 410 and the second amplifier circuit 420 of FIG. 4. Since those having ordinary skill in the art can refer to the embodiments of FIGS. 4-5 to appreciate the detail and modification of the embodiment of FIG. 6, repeated and redundant description is omitted here.

Figure 7:
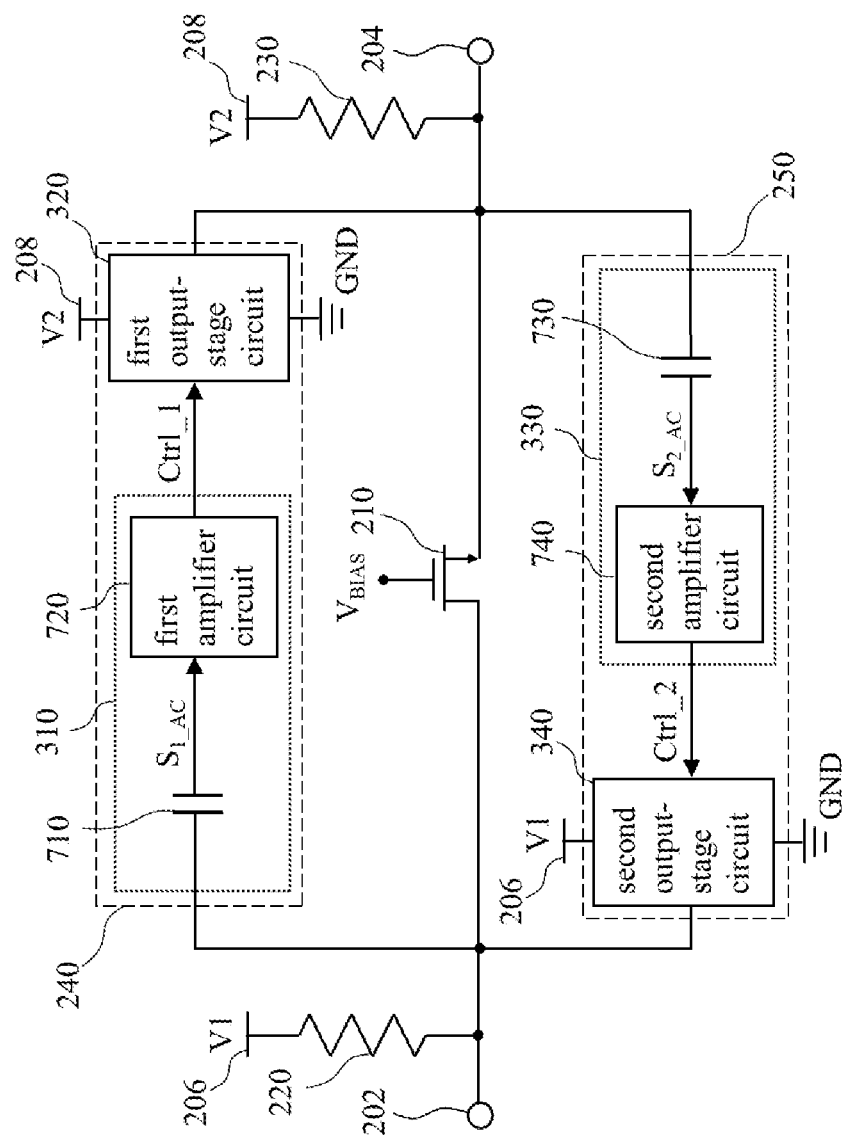
FIG. 7 shows another embodiment of the first and second AC coupling circuits of FIG. 3.

FIG. 7 shows another embodiment of the first AC coupling circuit 310 and the second AC coupling circuit 330 of FIG. 3. The first AC coupling circuit 310 includes a first capacitor 710 and a first amplifier circuit 720. The first capacitor 710 is configured to block the DC voltage from the first port 202 and output a first AC signal $S_{1\_AC}$ representing the variation in the AC voltage at the first port 202. The first amplifier circuit 720 is configured to generate the first control signal Ctrl_1 according to the first AC signal $S_{1\_AC}$. The second AC coupling circuit 330 includes a second capacitor 730 and a second amplifier circuit 740. The second capacitor 730 is configured to block the DC voltage from the second port 204 and output a second AC signal $S_{2\_AC}$ representing the variation in the AC voltage at the second port 204. The second amplifier circuit 740 is configured to generate the second control signal Ctrl_2 according to the second AC signal $S_{2\_AC}$.

Figure 8:
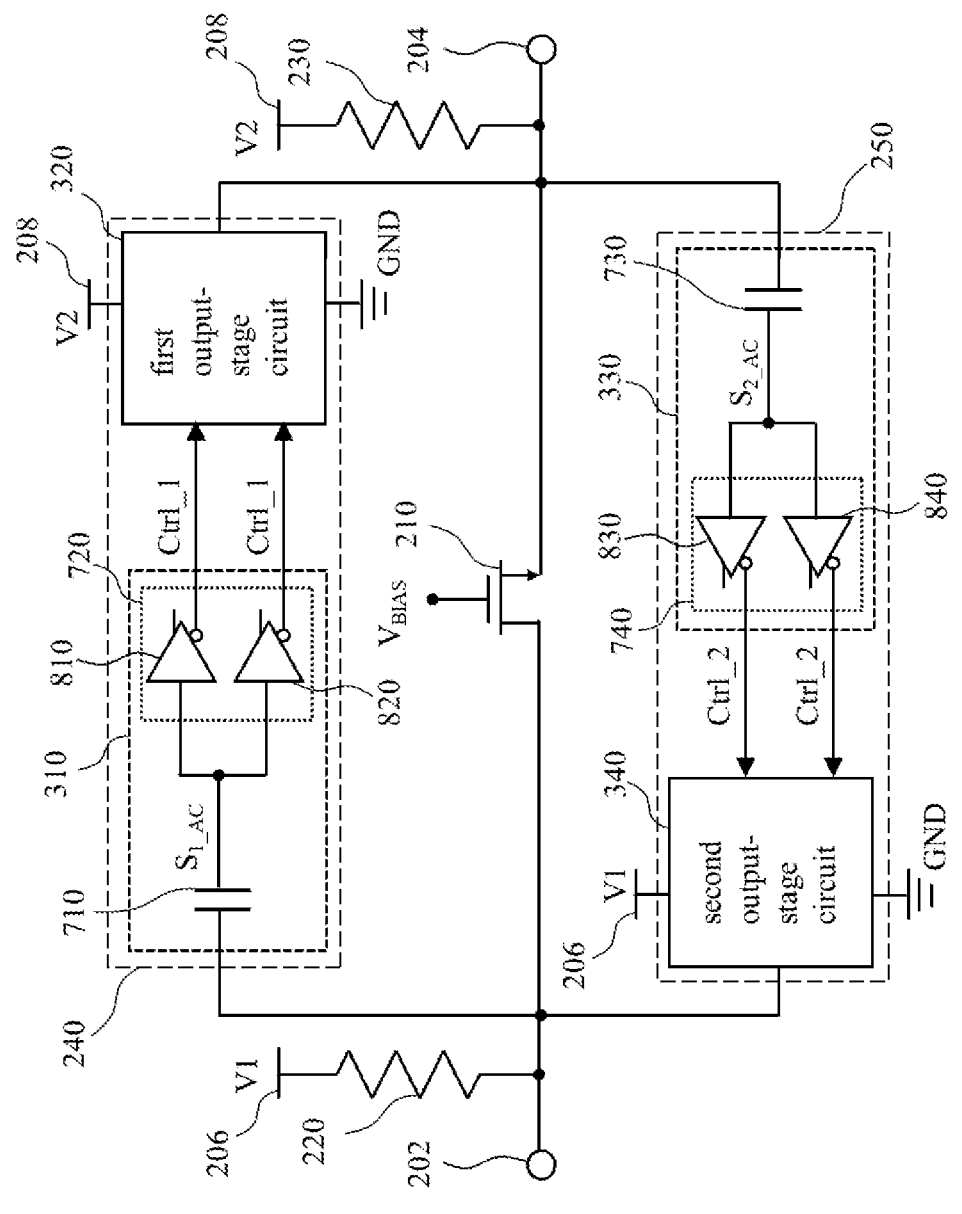
FIG. 8 shows an embodiment of the first and second amplifier circuits of FIG. 7.

FIG. 8 shows an embodiment of the first amplifier circuit 720 and the second amplifier circuit 740 of FIG. 7. As shown in FIG. 8, the first amplifier circuit 720 includes a first inverting amplifier 810 and a second inverting amplifier 820. The first inverting amplifier 810 is configured to amplify and invert the first AC signal $S_{1\_AC}$ and thereby output a first-switch control signal of the first control signal Ctrl_1 for controlling a first switch (e.g., the transistor P1 in FIG. 5) of the first output-stage circuit 320. The second inverting amplifier 820 is configured to amplify and invert the first AC signal $S_{1\_AC}$ and thereby output a second-switch control signal of the first control signal Ctrl_1 for controlling a second switch (e.g., the transistor N1 in FIG. 5) of the first output-stage circuit 320. The second amplifier circuit 740 includes a third inverting amplifier 830 and a fourth inverting amplifier 840. The third inverting amplifier 830 is configured to amplify and invert the second AC signal $S_{2\_AC}$ and thereby output a third-switch control signal of the second control signal Ctrl_2 for controlling a third switch (e.g., the transistor P2 in FIG. 5) of the second output-stage circuit 340. The fourth inverting amplifier 840 is configured to amplify and invert the second AC signal $S_{2\_AC}$ and thereby output a fourth-switch control signal of the second control signal Ctrl_2 for controlling a fourth switch (e.g., the transistor N2 in FIG. 5) of the second output-stage circuit 340. In an exemplary implementation, each inverting amplifier in FIG. 8 includes at least one of the following: an operational amplifier; an inverter; a comparator; and a level shifter.

Figure 9:
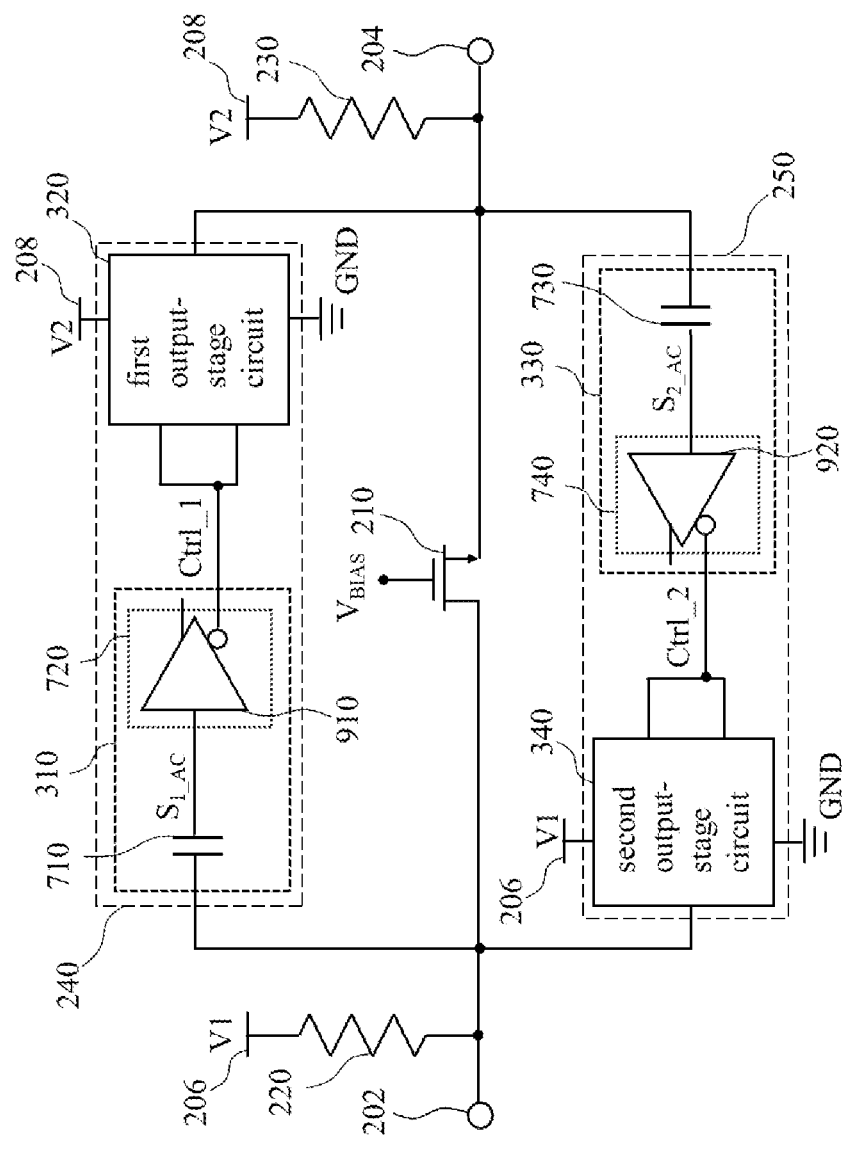
FIG. 9 shows another embodiment of the first and second amplifier circuits of FIG. 7.

FIG. 9 shows another embodiment of the first amplifier circuit 720 and the second amplifier circuit 740 of FIG. 7. As shown in FIG. 9, the first amplifier circuit 720 includes: a first inverting amplifier 910 configured to amplify and invert the first AC signal $S_{1\_AC}$ and thereby generate the first control signal Ctrl_1 for controlling a first switch (e.g., the transistor P1 in FIG. 5) and a second switch (e.g., the transistor N1 in FIG. 5) of the first output-stage circuit 320.

The second amplifier circuit 740 includes: a second inverting amplifier 920 configured to amplify and invert the second AC signal $S_{2\_AC}$ and thereby generate the second control signal Ctrl_2 for controlling a third switch (e.g., the transistor P2 in FIG. 5) and a fourth switch (e.g., the transistor N2 in FIG. 5) of the second output-stage circuit 340. In an exemplary implementation, each inverting amplifier in FIG. 9 includes at least one of the following: an operational amplifier; an inverter; a comparator; and a level shifter.

It is noted that those having ordinary skill in the art can selectively use some or all of the features of any embodiment in this specification or selectively use some or all of the features of multiple embodiments in this specification to implement the present invention as long as such implementation is practicable; in other words, the way to implement the present invention can be flexible based on the present disclosure.

To sum up, the bidirectional signal conversion circuit of the present disclosure can rapidly and directly change the voltage at its output stage and thereby increase its signal transmission speed. In addition, the bidirectional signal conversion circuit of the present disclosure can be realized in a cost-effective manner.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A bidirectional signal conversion circuit configured to perform a signal conversion between a first port and a second port, the bidirectional signal conversion circuit comprising:
   a switch coupled between the first port and the second port, and configured to operate according to a bias, a voltage at the first port, and a voltage at the second port;
   a first output-response enhancement circuit coupled between the first port and the second port, and configured to accelerate a transient response of an output port when the first port and the second port function as an input port and the output port respectively, the first output-response enhancement circuit including a first alternative-current (AC) coupling circuit and a first output-stage circuit, wherein:
      the first AC coupling circuit is coupled between the first port and the first output-stage circuit, and configured to output a first control signal according to a variation in the voltage at the first port; and
      the first output-stage circuit is coupled between the first AC coupling circuit and the second port, and configured to couple one of a second voltage terminal and a ground terminal with the second port according to the first control signal and thereby accelerate a variation in the voltage at the second port, wherein a voltage at the second voltage terminal is a second voltage; and
   a second output-response enhancement circuit coupled between the second port and the first port, and configured to accelerate the transient response of the output port when the second port and the first port function as the input port and the output port respectively, the second output-response enhancement circuit including a second AC coupling circuit and a second output-stage circuit, wherein:
      the second AC coupling circuit is coupled between the second port and the second output-stage circuit, and configured to output a second control signal according to the variation in the voltage at the second port; and
      the second output-stage circuit is coupled between the second AC coupling circuit and the first port, and configured to couple one of a first voltage terminal and the ground terminal with the first port according to the second control signal and thereby accelerate the variation in the voltage at the first port, wherein a voltage at the first voltage terminal is a first voltage different from the second voltage,
   the first AC coupling circuit includes:
      a first amplifier circuit configured to output a first amplification signal according to the voltage at the first port; and
      a first capacitor circuit configured to generate the first control signal according to the first amplification signal; and
   the second AC coupling circuit includes:
      a second amplifier circuit configured to output a second amplification signal according to the voltage at the second port; and
      a second capacitor circuit configured to generate the second control signal according to the second amplification signal.

2. The bidirectional signal conversion circuit of claim 1, wherein:
   the first amplifier circuit is configured to amplify and invert the voltage at the first port so as to output the first amplification signal;
   the first capacitor circuit includes:
      a first capacitor coupled between the first amplifier circuit and a first switch of the first output-stage circuit, and configured to generate a first-switch control signal of the first control signal according to the first amplification signal, in which the first switch is coupled between the second voltage terminal and the second port; and
      a second capacitor coupled between the first amplifier circuit and a second switch of the first output-stage circuit, and configured to generate a second-switch control signal of the first control signal according to the first amplification signal, in which the second switch is coupled between the ground terminal and the second port;
   the second amplifier circuit is configured to amplify and invert the voltage at the second port so as to output the second amplification signal; and
   the second capacitor circuit includes:
      a third capacitor coupled between the second amplifier circuit and a third switch of the second output-stage circuit, and configured to generate a third-switch control signal of the second control signal according to the second amplification signal, in which the third switch is coupled between the first voltage terminal and the first port; and
      a fourth capacitor coupled between the second amplifier circuit and a fourth switch of the second output-stage circuit, and configured to generate a fourth-switch control signal of the second control signal according to the second amplification signal, in which the fourth switch is coupled between the ground terminal and the first port.

3. The bidirectional signal conversion circuit of claim 2, wherein:
the first capacitor circuit further includes:
a first resistor including one terminal coupled with the first capacitor and the first switch and another terminal coupled with the second voltage terminal and the first switch; and
a second resistor including one terminal coupled with the second capacitor and the second switch and another terminal coupled with the ground terminal and the second switch; and
the second capacitor circuit further includes:
a third resistor including one terminal coupled with the third capacitor and the third switch and another terminal coupled with the first voltage terminal and the third switch; and
a fourth resistor including one terminal coupled with the fourth capacitor and the fourth switch and another terminal coupled with the ground terminal and the fourth switch.

4. The bidirectional signal conversion circuit of claim 1, wherein each of the first amplifier circuit and the second amplifier circuit includes at least one of the following: an operational amplifier; an inverter; a comparator; and a level shifter.

5. The bidirectional signal conversion circuit of claim 1, wherein each of the first output-stage circuit and the second output-stage circuit is a switch circuit.

6. A bidirectional signal conversion circuit configured to perform a signal conversion between a first port and a second port, the bidirectional signal conversion circuit comprising:
a switch coupled between the first port and the second port, and configured to operate according to a bias, a voltage at the first port, and a voltage at the second port;
a first output-response enhancement circuit coupled between the first port and the second port, and configured to accelerate a transient response of an output port when the first port and the second port function as an input port and the output port respectively, the first output-response enhancement circuit including a first alternative-current (AC) coupling circuit and a first output-stage circuit, wherein:
the first AC coupling circuit is coupled between the first port and the first output-stage circuit, and configured to output a first control signal according to a variation in the voltage at the first port; and
the first output-stage circuit is coupled between the first AC coupling circuit and the second port, and configured to couple one of a second voltage terminal and a ground terminal with the second port according to the first control signal and thereby accelerate a variation in the voltage at the second port, wherein a voltage at the second voltage terminal is a second voltage; and
a second output-response enhancement circuit coupled between the second port and the first port, and configured to accelerate the transient response of the output port when the second port and the first port function as the input port and the output port respectively, the second output-response enhancement circuit including a second AC coupling circuit and a second output-stage circuit, wherein:
the second AC coupling circuit is coupled between the second port and the second output-stage circuit, and configured to output a second control signal according to the variation in the voltage at the second port; and
the second output-stage circuit is coupled between the second AC coupling circuit and the first port, and configured to couple one of a first voltage terminal and the ground terminal with the first port according to the second control signal and thereby accelerate the variation in the voltage at the first port, wherein a voltage at the first voltage terminal is a first voltage different from the second voltage,
the first AC coupling circuit includes:
a first capacitor circuit configured to generate the first control signal according to the variation in the voltage at the first port; and
the second AC coupling circuit includes:
a second capacitor circuit configured to generate the second control signal according to the variation in the voltage at the second port.

7. The bidirectional signal conversion circuit of claim 6, wherein:
the first capacitor circuit includes:
a first capacitor configured to generate a first-switch control signal of the first control signal according to the variation in the voltage at the first port so as to control a first switch of the first output-stage circuit, in which the first switch is coupled between the second voltage terminal and the second port; and
a second capacitor configured to generate a second-switch control signal of the first control signal according to the variation in the voltage at the first port so as to control a second switch of the first output-stage circuit, in which the second switch is coupled between the second port and the ground terminal; and
the second capacitor circuit includes:
a third capacitor configured to generate a third-switch control signal of the second control signal according to the variation in the voltage at the second port so as to control a third switch of the second output-stage circuit, in which the third switch is coupled between the first voltage terminal and the first port; and
a fourth capacitor configured to generate a fourth-switch control signal of the second control signal according to the variation in the voltage at the second port so as to control a fourth switch of the second output-stage circuit, in which the fourth switch is coupled between the first port and the ground terminal.

8. The bidirectional signal conversion circuit of claim 7, wherein:
the first capacitor circuit further includes:
a first resistor including one terminal coupled with the first capacitor and the first switch and another terminal coupled with the second voltage terminal and the first switch; and
a second resistor including one terminal coupled with the second capacitor and the second switch and another terminal coupled with the ground terminal and the second switch; and
the second capacitor circuit further includes:
a third resistor including one terminal coupled with the third capacitor and the third switch and another terminal coupled with the first voltage terminal and the third switch; and a fourth resistor including one terminal coupled with the fourth capacitor and the fourth switch and another terminal coupled with the ground terminal and the fourth switch.

9. The bidirectional signal conversion circuit of claim 6, wherein:
the first capacitor circuit includes:
a first capacitor configured to generate the first control signal according to the variation in the voltage at the first port so as to control a first switch and a second switch of the first output-stage circuit, in which the first switch is coupled between the second voltage terminal and the second port, and the second switch is coupled between the second port and the ground terminal; and
the second capacitor circuit includes:
a second capacitor configured to generate the second control signal according to the variation in the voltage at the second port so as to control a third switch and a fourth switch of the second output-stage circuit, in which the third switch is coupled between the first voltage terminal and the first port, and the fourth switch is coupled between the first port and the ground terminal.

10. The bidirectional signal conversion circuit of claim 9, wherein:
the first capacitor circuit further includes:
a first resistor including one terminal coupled with the first capacitor and the first switch and another terminal coupled with the second voltage terminal and the first switch; and
a second resistor including one terminal coupled with the first capacitor and the second switch and another terminal coupled with the ground terminal and the second switch; and
the second capacitor circuit further includes:
a third resistor including one terminal coupled with the second capacitor and the third switch and another terminal coupled with the first voltage terminal and the third switch; and
a fourth resistor including one terminal coupled with the second capacitor and the fourth switch and another terminal coupled with the ground terminal and the fourth switch.

11. The bidirectional signal conversion circuit of claim 6, wherein each of the first output-stage circuit and the second output-stage circuit is a switch circuit.

* * * * *